United States Patent [19]

Tosaki et al.

[11] Patent Number: 4,490,429

[45] Date of Patent: Dec. 25, 1984

[54] PROCESS FOR MANUFACTURING A MULTILAYER CIRCUIT BOARD

[75] Inventors: Hiromi Tosaki, Yokohama; Nobuyuki Sugishita, Yokosuka; Akira Ikegami, Yokohama, all of Japan

[73] Assignee: Hitachi, Ltd., Tokyo, Japan

[21] Appl. No.: 398,862

[22] Filed: Jul. 16, 1982

[30] Foreign Application Priority Data

Jul. 24, 1981 [JP] Japan .................... 56-115039

[51] Int. Cl.³ ............................................. B32B 3/00
[52] U.S. Cl. .................................. 428/195; 174/68.5; 427/96; 427/97; 428/204; 428/210; 428/131; 428/901
[58] Field of Search ............... 428/204, 131, 195, 210, 428/402, 404, 901; 427/96, 97; 174/68.5, 52 FP

[56] References Cited

U.S. PATENT DOCUMENTS 4,301,324 11/1981 Kuman et al. ................. 174/52 FP

FOREIGN PATENT DOCUMENTS 111517 8/1979 Japan .

*Primary Examiner*—James J. Bell
*Attorney, Agent, or Firm*—Antonelli, Terry & Wands

[57] ABSTRACT

The multilayer circuit board is constituted of an inorganic insulating material such as a crystallizable glass, crystalline oxide or noncrystallized glass; a conductive material such as a metal or a mixture of a metal with noncrystallized glass; a resistor material consisting of a mixture of a conductive material with the crystallizable glass or noncrystallized glass; and a dielectric material consisting of a mixture of a barium titanate-other oxide mixture with the noncrystallized glass or crystallizable glass, of a lead-containing perovskite type oxide or of a lead-containing laminar bismuth oxide, said board has a multilayer structure wherein a first insulating layer; a first resistor circuit or alternatively first capacitor circuit or alternatively first resistor-capacitor circuit; a second insulating layer; a second resistor circuit or alternatively second capacitor circuit or alternatively second resistor-capacitor circuit are superposed in this order, provided that the second insulating layer has a through-hole(s) filled with the conductive material, and a process for producing the same.

14 Claims, 1 Drawing Figure

U.S. Patent  Dec. 25, 1984  4,490,429
FIG.
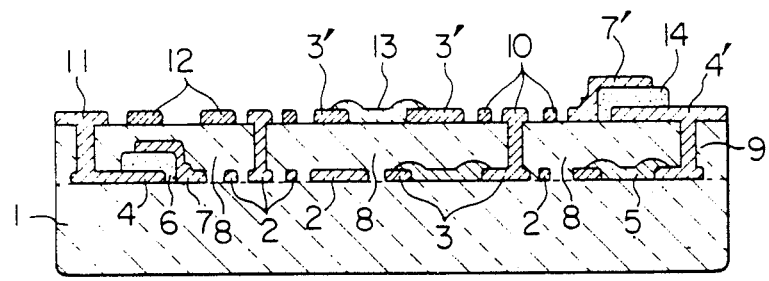

PROCESS FOR MANUFACTURING A MULTILAYER CIRCUIT BOARD

BACKGROUND OF THE INVENTION

1. Field of the Invention

This invention relates to a multilayer circuit board in which not only wiring conductor but also resistor and capacitor are multilayered, as well as to a process for manufacturing said multilayer circuit board.

2. Brief Description of the Prior Art

In general electronic circuits, IC sealed with ceramics or the like, or so-called sealed IC, are used. If a non-sealed IC is used in stead of sealed IC, an IC-connecting conductor having a conductor-conductor distance of about 200 $\mu$m must be formed on a substrate because non-sealed IC is smaller than sealed IC and the distance between connecting terminals is shorter in non-sealed IC than in sealed IC.

However, if the connecting conductors are formed by a so-called dry process which comprises printing a conductor paste on a sintered ceramic substrate (hereinafter, simply referred to as a "ceramic substrate") followed by drying and firing it, short-circuit takes place between the wiring conductors unless the conductor-conductor distance is as large as about 400 $\mu$m, because such dry process causes blotting in printing.

On the contrary, according to the so-called wet process which comprises printing a conductor paste on an unsintered ceramic substrate (hereinafter, simply referred to as a "green sheet") composed mainly of alumina, followed by drying and sintering it, a solvent in the printed conductor paste permeates into the green sheet, so that no blotting takes place in printing. In addition, the green sheet shrinks by 10-20% upon sintering. Therefore, fine wiring conductors having high density can be formed.

However, since the sintering of a green sheet composed mainly of alumina progresses at a temperature of 1,500°-1,600° C., the wiring conductor must be formed of a refractory metal not changing its quality upon sintering, such as molybdenum, tungsten, manganese or the like. Further, if resistors and dielectrics are provided in the inner layer of a multilayer circuit board, they change their quality at the time of sintering the green sheet. Therefore, in the multilayer circuit board, it is necessary to form the resistors and dielectrics in the uppermost layer after sintering the green sheet.

If a green sheet can be sintered at a temperature below 1,000° C., substances other than the above-mentioned ones can be used as wiring conductors, and resistors and dielectrics can be provided in the inner layer of the ceramic multilayer wiring board.

As inorganic insulating materials for the green sheet capable of being sintered at a temperature below 1,000° C., there are known a crystallizable glass consisting of $\beta$-spodumeme as a main component and lithium metasilicate as a subsidiary component, and a crystallizable glass consisting of $\alpha$-cordierite as a main component and clinoenstatite as a subsidiary component.

However, these materials must be heated for too long a period of time (if the time period of heating was short, the peeling of wiring conductor took place) because they required a heating rate of 2° C./minute or less, a retention time of 1-5 hours at a sintering temperature, and a cooling rate of 4° C./minute or less.

SUMMARY OF THE INVENTION

The object of the invention is to provide a multilayer circuit board free from the above-mentioned faults of prior arts, having wiring conductors of high density and high fineness and having resistors and dielectrics provided in the inner layer thereof, as well as to provide a process for manufacturing said multilayer circuit board.

Thus, the multilayer circuit board of this invention is constituted of:

(I) one inorganic insulating material selected from the group consisting of (i) a crystallizable glass, (ii) a mixture of an insulating crystalline oxide and noncrystallized glass having a softening point of 750° C. or below and (iii) an insulating polycrystalline oxide, all having a sintering temperature range of 600°-1,000° C., (II) one conductive material selected from the group consisting of (i) a metal only and (ii) a mixture of a metal and a noncrystallized glass having a sintering temperature of 600°-1,000° C., a softening temperature of 150°-250° C. lower than that of any inorganic insulating material selected from (I) above and having a coefficient of thermal expansion of $10 \times 10^{-7}/°C.$ greater to $30 \times 10^{-7}/°C.$ smaller than that of said inorganic insulating material, (III) a resistor material consisting of a mixture of one conductive material selected from the group consisting of a metal, $RuO_2$, $Rh_2O_3$, $IrO_2$, $Bi_2Ru_2O_7$, $Pb_2Ru_2O_6$, $Bi_2Rh_2O_6$, $Pb_2Rh_2O_5$, $Bi_2Ir_2O_7$, $Pb_2Ir_2O_6$, $MoSi_2$ and $CoSi$ with (i) the same non crystallized glass as defined in (II)-(ii), or (ii) a crystallizable glass having a crystallization temperature of 50° C. higher to 50° C. lower than the sintering temperature of any inorganic insulating material selected from (I) above and having a coefficient of thermal expansion of $10 \times 10^{-7}/°C.$ greater to $30 \times 10^{-7}/°C.$ smaller than that of said inorganic insulating material, and (IV) a dielectric material consisting of (i) a mixture of (a) a mixture, having a sintering temperature of 1,000° C. or higher, of barium titanate with one member selected from the group consisting of magnesium titanate, calcium titanate, strontium titanate, calcium zirconate, barium zirconate, nickel stannate, calcium stannate, barium oxide and lanthanum oxide and (b) the same noncrystallized glass as defined in (II)-(ii) above or the same crystallizable glass as defined in (III)-(ii) above, or (ii) a lead-containing perovskite type oxide having a sintering temperature of 800°-1,000° C., or (iii) a lead-containing laminar bismuth oxide having a sintering temperature of 800°-1,000° C., and has a multilayer structure wherein:

(A) a first insulating layer consisting of the above-mentioned material (I), and (B) a first resistor circuit consisting of the above-mentioned materials (II) and (III) or, alternatively, (C) a first capacitor circuit consisting of the above-mentioned materials (II) and (IV) or, alternatively, (C') a first resistor-capacitor circuit consisting of the above-mentioned materials (II), (III) and (IV), and (D) a second insulating layer consisting of the above-mentioned material (I), and (E) a second resistor circuit consisting of said materials (II) and (III) or, alternatively, (F) a second capacitor circuit consisting of said materials (II) and (IV) or, alternatively, (F') a second resistor-capacitor circuit consisting of said materials (II), (III) and (IV) are superposed in the mentioned order, provided that the second insulating layer (D) has a through-hole(s) filled with said material (II) and, optionally, at least one layer of (E), (F) or (F') is superposed over said layer (D) having the conductor filled through-hole(s) so as to give a multilayer structure.

The multilayer circuit board of this invention can be produced by the following process.

Thus, the process comprises (i) preparing the first insulating layer as a green sheet from an insulator paste consisting of a powder of the inorganic insulating material (I) defined above and an organic solvent, (ii) printing, on said first insulating layer, a conductor paste consisting of a powder of the conductor material (II) defined above and a vehicle and a resistor paste consisting of a powder of the resistor material (III) defined above and a vehicle or a dielectric paste consisting of a powder of the dielectric material (IV) defined above and a vehicle, or printing said conductor paste and said resistor paste and said dielectric paste on the first insulating layer, followed by drying the printed paste, thereby forming the first resistor circuit, the first dielectric circuit or the first resistor-capacitor circuit, (iii) then printing said insulator paste on the circuit-forming surface of said green sheet so as to leave the connecting part of the circuit as the through-hole(s), followed by drying the printed paste, thereby forming the second insulating layer, (iv) filling said through-hole(s) with said conductor paste, (v) printing, on the second insulating layer, said conductor paste and said resistor paste, or said conductor paste and said dielectric paste, or said conductor paste and said resistor paste and said dielectric paste, followed by drying the printed paste, thereby forming the second resistor circuit, the second capacitor circuit or the second resistor-capacitor circuit, and (vi) optionally, thereover forming at least one insulating layer and at least one resistor layer, at least one dielectric layer or at least one resistor-dielectric layer by the same means as above, and finally carrying out firing.

The firing is carried out for 10-30 minutes at a temperature of 600°-1,000° C. at which the above-mentioned inorganic insulating material can be sintered and the glass in the above-mentioned conductor paste, resistor paste and dielectric paste can soften and melt.

When noncrystallized glasses different in softening point are used in the inorganic insulating material and the resistor paste, the heating rate and the cooling rate are preferably 50°-100° C./minute in the temperature range higher than the lower softening point. If the rate of heating or cooling is smaller than above, the excessive melting of glass causes the deformation of a circuit pattern and uneven shrinkage of a sintered substrate causes a warp. On the other hand, if the rate of heating or cooling is greater than above, the warp or waving of substrate occurs due to the unevenness of heating and cooling.

Hereunder, the materials used in this invention will be explained. As the materials usable for the formation of a insulating layer, (i) crystallizable glass, (ii) mixture of insulating crystalline oxide and noncrystallized glass and (iii) insulating polycrystalline oxide can be referred to. All the substances constituting (i), (ii) and (iii) can be sintered at a temperature of 600°-1,000° C.

As examples of crystallizable glass which can be sintered at 600°-1,000° C., there can be referred to the crystallizable glasses which crystallites of anorthite ($CaAl_2Si_2O_8$), celsian ($BaAl_2Si_2O_8$), nepheline ($NaAlSiO_4$) or sphene ($CaTiSiO_5$) deposit at the time of sintering. One of them is used for a crystallizable glass.

As examples of the insulating crystalline oxide which can be sintered at 600°-1,000° C., metal oxides such as alumina ($Al_2O_3$), silica ($SiO_2$), magnesia (MgO), calcia (CaO), barium oxide (BaO), zirconia ($ZrO_2$), calcium zirconate ($CaZrO_3$) and the like, magnesia spinel ($MgAl_2O_4$), alumino-silicates such as anorthite ($CaAl_2Si_2O_8$), celsian ($BaAl_2Si_2O_8$) and the like, and silicates such as zircon ($ZrSiO_4$) and the like can be referred to. They may be used either alone or in the form of mixture of two or more.

As the noncrystallized glass having a sintering temperature of 600°-1,000° C., to be mixed with said insulating crystalline oxide, those having a softening point of 750° C. or below and having a sintering temperature of 600°-1,000° C. are preferable, among which lead aluminoborosilicate glasses containing BaO, CaO, ZnO, SrO, $TiO_2$, $Bi_2O_3$ and the like are particularly preferable.

It is also allowable that this glass contains a small amount of an alkali metal oxide such as $Na_2O$, $Li_2O$, $K_2O$ and the like.

As examples of the insulating polycrystalline oxide which can be sintered at 600°-1,000° C., germanium oxide ($GeO_2$), as well as mixtures prepared by adding any one of $SiO_2$, $Al_2O_3$, CaO, PbO, $Bi_2O_3$, $B_2O_3$ and the like to $GeO_2$, can be referred to.

As the conductor paste used for forming a wiring conductor, pastes composed of a vehicle and at least one metal selected from the group consisting of gold, silver, platinum and palladium or an alloy metal powder such as Ag-Pd or the like are used.

For further improving the adhesion between the wiring conductor and the insulating layer, a noncrystallized glass is mixed into the above-mentioned conductor paste composed of a metal powder and vehicle, provided that said noncrystallized glass must have a sintering temperature of 600°-1,000° C., its softening point must be 150°-250° C. lower than the sintering temperature of the inorganic insulating material used in the insulating layer, and its coefficient of thermal expansion must be in the range of $10 \times 10^{-7}/°C$. greater than that of said inorganic insulating material to $30 \times 10^{-7}/°C$. smaller than that of said inorganic insulating material.

As the resistor paste used for forming resistor, pastes composed of a conductive powder, a noncrystallized glass or crystallizable glass, and a vehicle are used, provided that said conductive powder is at least one member selected from the group consisting of metal powders such as powdered gold, silver, platinum, palladium and the like, ruthenium oxides such as $RuO_2$, $Bi_2Ru_2O_7$, $Pb_2Ru_2O_6$ and the like, iridium oxides such as $IrO_2$, $Bi_2Ir_2O_7$, $Pb_2Ir_2O_6$ and the like and silicides such as $MoSi_2$, $CoSi_2$ and the like; and said noncrystallized glass must have a sintering temperature of 600°-1,000° C., its softening point must be 150°-250° C. lower than the firing temperature of the inorganic insulating material used in the insulating layer, and its coefficient of thermal expansion must be in the range of $10 \times 10^{-7}/°C$. greater than that of said inorganic insulating material to $30 \times 10^{-7}/°C$. smaller than that of said inorganic insulating material; and said crystallizable glass must have a sintering temperature of 600°-1,000° C., its crystallization temperature must be in the range of 50° C. lower than the sintering temperature of said inorganic insulating material used in the insulating layer to 50° C. higher than the sintering temperature of said inorganic insulating material, and its coefficient of thermal expansion must be in the range of $10 \times 10^{-7}/°C$. greater than that of said inorganic insulating material to $30 \times 10^{-7}/°C$. smaller than that of said inorganic insulating material.

If the softening point or crystallization temperature of the glasses is lower than the above-mentioned temperature range, noncrystallized glass flows at the sintering temperature of the inorganic insulating material used in the insulating layer so that the pattern of resistor becomes irregular or the glass permeates into insulating layer and causes the uneven shrinkage or warping of insulating layer at the time of sintering. In the case of crystallizable glass, under such conditions, the glass is crystallized to become highly viscous until it becomes unable to follow the shrinkage of insulating layer at the time of sintering, which causes the warping of wiring board.

On the other hand, if the softening point or crystallization temperature of glass is higher than the range mentioned above, the noncrystallized glass cannot be sufficiently molten so that a dense resistor cannot be obtained, while the crystallizable glass flows so that the pattern of resistor become irregular and the glass permeates into the insulating layer to cause uneven shrinkage at the time of sintering, which causes the warping of wiring board.

As the dielectric paste used for forming the dielectric, there can be used pastes composed of a powder of dielectric having a high dielectric constant, a noncrystallized glass or crystallizable glass and a vehicle, provided that said dielectric having a high dielectric constant is a mixture of barium titanate and one substance selected from the group consisting of magnesium titanate, calcium titanate, strontium titanate, calcium zirconate, barium zirconate, nickel stannate, calcium stannate, barium oxide, lanthanum oxide and the like and has a sintering temperature of 1,000° C. or higher; said noncrystallized glass has a sintering temperature of 600°–1,000° C., its softening point is 150°–250° C. lower than the sintering temperature of the inorganic insulating material used in the insulating layer, and its coefficient of thermal expansion is in the range of $10 \times 10^{-7}/°C$. greater than that of said inorganic insulating material to $30 \times 10^{-7}/°C$. smaller than that of said inorganic insulating material; and said crystallizable glass has a sintering temperature of 600°–1,000° C., its crystallization temperature is in the range of 50° C. lower than the sintering temperature of the inorganic insulating material used in the insulating layer to 50° C. higher than said sintering temperature, and its coefficient of thermal expansion is in the range of $10 \times 10^{-7}/°C$. greater than that of said inorganic insulating material to $30 \times 10^{-7}/°C$. smaller than that of said inorganic insulating material. Otherwise, as the dielectric paste used for forming the dielectric, there can also be used pastes composed of one powdered dielectric having a high dielectric constant, having a sintering temperature of 800°–1,000° C. and capable of being sintered at a temperature in the range of 50° C. lower to 150° C. higher than the sintering temperature of the inorganic insulating material used in the insulating layer, which is selected from the group consisting of lead-containing perovskite type oxides such as $Pb(Fe_{2/3}W_{1/3})O_3$-$PbTiO_3$, $Pb(Fe_{2/3}W_{1/3})O_3$-$Pb(Zn_{1/3}Nb_{2/3})O_3$, $Pb(Fe_{2/3}W_{1/3})O_3$-$Pb(Fe_{1/2}Nb_{1/2})O_3$ and the like and lead-containing laminar bismuth oxides such as $Pb_2Bi_4Ti_5O_{18}$-$PbTiO_3$ and the like.

If the softening point of crystallization temperature of glass is lower than the temperature range mentioned above, the noncrystallized glass flows at the sintering temperature of the inorganic insulating material so that the pattern of dielectric becomes irregular and the glass permeates into the insulating layer to cause the uneven shrinkage or warping of the insulating layer at the time of sintering, while the crystallizable glass is crystallized to become highly viscous, until the glass becomes unable to follow the shrinkage of insulating layer at the time of sintering so that the wiring board is warped.

On the other hand, if the softening point or crystallization temperature of glass is higher than the temperature range mentioned above, the noncrystallized glass cannot be sufficiently molten so that a dense dielectric cannot be obtained, while the crystallizable glass flows to make the pattern of dielectric irregular or it permeates into the insulating layer to cause the uneven shrinkage of insulating layer at the time of sintering, which cause the warping of wiring board.

This invention will be explained in more detail with reference to the following examples.

BRIEF DESCRIPTION OF THE DRAWINGS

FIG. 1 is a cross-sectional view illustrating one example of the multilayer circuit board of this invention.

DESCRIPTION OF THE PREFERRED EMBODIMENTS

Example 1

A crystallizable glass was used as the inorganic insulating material, a noncrystallized glass was used as a binder glass for resistor, and a dielectric material having a low melting point was used.

The pastes for green sheet and interlayer insulator were prepared in the following manner. Thus, oxides, carbonates and hydroxides were weighed out so that the proportions (% by weight) of the components came to the following: 30% $SiO_2$, 13% $CaO$, 12% $Al_2O_3$, 11%, $ZrO_2$ 28%, $PbO$ 4% $B_2O_3$ and 2% $MgO$. They were mixed together in a ball mill, and the mixture was fused in a platinum beaker at 1,500° C. and then poured into water for the purpose of rapid cooling, whereby a roughly crushed glass was obtained. It was pulverized by means of an agate mortar and a ball mill to obtain a glass powder having an average particle size of 2.0 μm. It exhibited an exothermic peak at 820° C. which corresponded to the deposition of crystalline anorthite ($CaAl_2Si_2O_8$). When heat-treated at 850° C., it showed a coefficient of thermal expansion of $52 \times 10^{-7}/°C$.

According to the usual processes for producing green sheets and interlayer insulator pastes, the glass powder was made into a green sheet and an insulator paste in the following manner. Thus, 100 g of the glass powder was mixed with 6 g of polyvinyl butyral, to which were added 3 cc of butyl phthalyl butyl glycolate and 60 cc of a solvent mixture consisting of 60% by volume of trichlene, 17% by volume of perchlene and 23% by volume of butyl alcohol. The mixture was kneaded in an alumina ball mill to obtain a slurry. It was passed through a doctor blade, dried, formed into a sheet having a thickness of 0.8 mm and then appropriately cut into green sheets. An interlayer insulator paste was prepared by dissolving 50 g of ethyl cellulose into 450 g of tridecanol to obtain an organic vehicle, adding 40 cc of the organic vehicle to 100 g of the glass powder and then kneading the mixture in an alumina kneader.

The binder glass for conductor and resistor was a noncrystallized glass having the following composition (by weight): 60% $SiO_2$, 14% PbO, 9% $Al_2O_3$, 7% CaO, 5% $B_2O_3$, 1% MgO, 2% $Na_2O$ and 2% $K_2O$. It had a softening point of 680° C. and a coefficient of thermal expansion of $60 \times 10^{-7}/°C$. It was pulverized until the average particle size reached 2.5 μm. A conductor paste was prepared by mixing an Ag-Pd mixed powder into the glass powder in a proportion of 9.7 g mixed powder per 0.3 g glass powder, then adding an organic vehicle in a porportion of 3 cc vehicle per 0.3 g glass powder, and kneading the resulting mixture. Similarly, a resistor paste was prepared by mixing $RuO_2$ having an average particle size of 0.8 μm to the glass powder in a proportion of 2.0 g $RuO_2$ per 8.0 g glass powder, then adding an organic vehicle in a proportion of 3 cc vehicle per 8.0 g glass powder, and then kneading the resulting mixture.

A dielectric having a low melting point was prepared by mixing PbO, $Fe_2O_3$, $WO_3$ and $TiO_2$, heat-treating the mixture at 800° C. for 2 hours to synthesize 0.75 $Pb(Fe_{2/3}W_{1/3})O_3$—0.25 $PbTiO_3$ and pulverizing the latter until its average particle size reached 2.3 μm. A dielectric paste was prepared by adding an organic vehicle to the powder in a proportion of 3 cc vehicle per 10 g powder. This dielectric was sintered with shrinkage at 850° C. Its melting point was 1,100° C.

Next, the process for producing a multilayer circuit board will be mentioned with reference to FIG. 1. On a glass green sheet 1 prepared in the above-mentioned manner was the above-mentioned conductor paste printed to form a first layer wiring 2, resistor electrode 3 and capacitor electrode 4. After drying them, the above-mentioned resistor paste was printed to form a first layer resistor 5. Then, the above-mentioned dielectric paste was printed to form a first layer capacitor 6, and the above-mentioned conductor paste was printed to form a capacitor opposite electrode 7. Then, the above-mentioned interlayer insulator paste was printed to form an interlayer insulator 8. At this time, a through-hole 9 was formed for the purpose of electrically connecting the up and down sides of the layer. Then, the above-mentioned conductor paste was printed to make an interlayer continuity through the through-hole and simultaneously form a second layer wiring 10, resistor electrode 3', capacitor electrode 4', capacitor opposite electrode 7', external connection terminal 11 and parts-mounting terminal 12 is the same manner as in the first layer. Then, a second layer resistor 13 and second layer capacitor 14 were formed by printing the above-mentioned resistor paste and the above-mentioned dielectric paste and further printing the above-mentioned conductor paste on the dielectric layer.

The unsintered substrate which had been printed and multilayered in the above-mentioned manner was heat treated in a thick film belt furnace of an air-firing type retaining a temperature of 850° C. for 10 minutes. Though the green sheet showed a shrinkage of 15% at this time, neither any warping of a substrate nor any peeling and cracking of a resistor film and dielectric film was found.

Example 2

As the inorganic insulating material, a mixture of an insulating crystallizable oxide and noncrystallized glass was used. As the binder glass for resistor, a crystallizable glass was used. As the binder glass of dielectric, noncrystallized glass was used.

A green sheet and interlayer insulator paste were prepared in the following manner. Thus, oxides, carbonates and hydroxides were weighed out so that the proportions (by weight) of the components came to the following: 55% $SiO_2$, 17% PbO, 9% $Al_2O_3$, 8% CaO, 5% $B_2O_3$, 1% MgO, 3% $Na_2O$ and 2% $K_2O$. They were mixed together in a ball mill and then treated in the same manner as in Example 1 to obtain a powder of noncrystallized glass having an average particle size of 2.5 μm and a softening point of 690° C. To 70 g of this glass powder, 15 g of an alumina powder having an average particle size of 0.6 μm, 10 g of a magnesia spinel ($MgAl_2O_4$) powder having an average particle size of 2.0 μm and 5 g of a calcium zirconate ($CaZrO_3$) powder having an average particle size of 2.5 μm were added, all in terms of proportion, and the resulting mixture was homogenized and made into a green sheet and an interlayer insulator paste in the same manner as in Example 1. Though this green sheet slightly increased the extent of shrinkage with elevation of heat-treatment temperature, it showed a great shrinkage at 800° C. and the shrinkage at up to 900° C. was almost constantly about 16%. Based on this finding, a temperature of 850° C. was adopted as the firing temperature of the green sheet.

The binder glass of resistor was prepared in the following manner. Thus, oxides, carbonates and hydroxides were weighed out so that the proportions of the components (by weight) came to the following: 31% $SiO_2$, 4% $B_2O_3$, 10% $Al_2O_3$, 11% $TiO_2$, 25% BaO, 12% ZnO, 4% CaO and 3% MgO. They were treated in the same manner as in Example 1 to obtain a glass powder having an average particle size of 2.0 μm. This glass powder was a crystallizable glass having an exothermic peak at 840° C. corresponding to the deposition of the crystal of celsian ($BaAl_2Si_2O_8$). To 8.0 g of this glass powder, 2.0 g of a $Bi_2Ru_2O_7$ powder having an average particle size of 1.5 μm was mixed, in terms of proportion. Then, 3 cc of an organic vehicle was added to 10 g of this powdery mixture, in terms of proportion, and the resulting mixture was kneaded to obtain a resistor paste.

As the noncrystallized binder glass for the dielectric, a finely powdered glass having the following composition (by weight): 60% $Bi_2O_3$, 15% PbO, 11% $SiO_2$, 5% $Al_2O_3$, 4% CaO, 3% ZnO and 2% $B_2O_3$, and having an average particle size of 2.7 μm was used. This glass powder had a softening point of 530° C.

The dielectric paste was prepared by mixing, all in terms of proportion, 0.3 g of the finely powdered glass prepared in the above-mentioned manner with 9.7 g of a pulverized barium titanate ($BaTiO_3$) powder having an average particle size of 2.5 μm and kneading 100 g of the resulting powdery mixture together with 3 cc of an organic vehicle.

A conductor paste composed of an Ag-Pd powder mixture and an organic vehicle, the resistor paste, the dielectric paste and the interlayer insulator paste which had been newly prepared were printed on the green sheet and formed into a multilayered sheet in the same manner as in Example 1. The multilayered sheet was heat-treated in a thick film belt furnace of an air-firing type capable of keeping a temperature of 850° C. for 10 minutes to obtain a circuit board shown in FIG. 1. At this time the board showed a shrinkage of 16%, but neither any warp of the substrate nor any peeling and cracking of resistor and dielectric was found.

Example 3

As the inorganic insulating material, an oxide ceramic having a low melting point was used. As the binder glass for resistor and dielectric, a crystallizable glass was used.

A green sheet and interlayer insulating paste were prepared in the following manner. Thus, oxides, carbonates and hydroxides were weighed out so that proportions (by weight) of the components came to the following: 35% $GeO_2$, 35% BaO, 14% $Al_2O_3$, 7% CaO, 5% PbO, 3% $Bi_2O_3$ and 1% $B_2O_3$. They were mixed together in a ball mill, mixed with an aqueous solution of polyvinyl alcohol and then formed into a disc under pressure. It was heat treated under conditions enough to maintain a temperature of 900° C. for 2 hours. The sintered body was pulverized in an agate mortar and ball mill to obtain a powder having an average particle size of 2.2 μm.

In the same manner as in Example 1, this powder was made into a green sheet and an interlayer insulator paste.

As the crystallizable glass for resistor and dielectric, a glass powder having the same inorganic composition of the green sheet as in Example 1 was used. A resistor paste was prepared by mixing 8.0 g of a ruthenium oxide ($RuO_2$) powder having an average particle size of 0.8 μm with 2.0 g (in terms of proportion) of the binder glass powder and then kneading the mixture together with an organic vehicle. A dielectric paste was prepared by mixing 9.5 g of a barium titanate ($BaTiO_3$) powder having an average particle size of 2.7 μm with 0.5 g (in terms of proportion) of the binder glass powder and then kneading the mixture together with an organic vehicle.

On the green sheet thus prepared, the conductor paste prepared in Example 1, the resistor paste, the dielectric paste and the interlayer insulator paste which had been newly prepared were printed and formed into a multilayer sheet in the same manner as in Example 1. The multilayer sheet was heat-treated in a thick film belt furnace of an air firing type capable of keeping a temperature of 850° C. for 20 minutes to obtain the circuit board shown in FIG. 1. Neither any warping of substrate nor any peeling and cracking of resistor and dielectric was found.

What is claimed is:

1. A multilayer circuit board constituted of the following materials:
   (I) an inorganic insulating material selected from the group consisting of: (i) a crystallizable glass, (ii) a mixture of an insulating crystalline oxide and non-crystallized glass having a softening point of 750° C. or below, and (iii) an insulating polycrystalline oxide, all having a sintering temperature in the range of 600°–1,000° C.;
   (II) a conductive material selected from a group consisting of (i) a metal only, and (ii) a mixture of a metal and non-crystallized glass having a sintering temperature in the range of 600°–1,000° C., a softening temperature of 150°–250° C. lower than that of any inorganic insulating material selected from (I) and a coefficient of thermal expansion of $10 \times 10^{-7}/°C$. greater to $30 \times 10^{-7}/°C$. smaller than that of said inorganic insulating material;
   (III) a resistor material consisting of a mixture of one conductive material selected from the group consisting of a metal, $RuO_2$, $Rh_2O_3$, $IrO_2$, $Bi_2Ru_2O_7$, $Pb_2Ru_2O_6$, $Bi_2Rh_2O_6$, $Pb_2Rh_2O_5$, $Bi_2Ir_2O_7$, $Pb_2Ir_2O_6$, $MoSi_2$ and CoSi and one material selected from the group consisting of: (i) the same non-crystallized glass as defined in (II)-(ii), and (ii) a crystallizable glass having a crystallization temperature of 50° higher to 50° C. lower than the sintering temperature of any inorganic insulating material selected from (I) and also having a coefficient of thermal expansion of $10 \times 10^{-7}/°C$. greater to $30 \times 10^{-7}/°C$. smaller than that of said inorganic insulating material; and
   (IV) a dielectric material selected from the group consisting of: (i) an admixture of (a) a mixture, having a sintering temperature of 1,000° C. or higher, of barium titanate with one member selected from the group consisting of magnesium titanate, calcium titanate, strontium titanate, calcium zirconate, barium zirconate, nickel stannate, calcium stannate, barium oxide and lanthanum oxide, and (b) a material selected from the group consisting of: the non-crystallized glass as defined in (II)-(ii), and the crystallizable glass as defined in (III)-(ii); (ii) a lead-containing perovskite type oxide having a sintering temperature of 800°–1,000° C., and (iii) a lead-containing laminar bismuth oxide having a sintering temperature of 800°–1,000° C.;

said materials having a multilayer structure comprising:
   (A) a first insulating layer consisting of said inorganic insulating material; and
   (B) a first circuit disposed on a surface of said first insulating layer, said first circuit being a circuit selected from the group consisting of: (1) a first resistor circuit, having resistors of said resistor material (III) and conductors of said conductive material (II) in electrical connection; (2) a first capacitor circuit, having capacitors of said dielectric material (IV) and conductive material (II) for electrodes, and conductors of said conductive material (II), in electrical connection; and (3) a first resistor-capacitor circuit, having resistors of said resistor material (III), having capacitors of said dielectric material (IV) and conductive material (II) for electrodes, and conductors of said conductive material (II), the resistors, capacitors and conductors being in electrical connection; and
   (C) a second insulating layer consisting of said inorganic insulating material (I), formed on said first circuit; and
   (D) a second circuit disposed on a surface of said second insulation layer opposite the surface thereof adjacent the first circuit, said second circuit being a circuit selected from the group consisting of: (1) a second resistor circuit, having resistors of said resistor material (III) and conductors of said conductive material (II) in electrical connection; (2) a second capacitor circuit, having capacitors of said dielectric material (IV) and conductive material (II) for electrodes, and conductors of said conductive material (II), in electrical connection; and (3) a second resistor-capacitor circuit having resistors of said resistor material (III), capacitors of said dielectric material (IV) and conductive material (II) for electrodes, and conductors of said conductive material (II), the resistors, capacitors and conductors being in electrical connection, the second insulating layer (D) having at least one through-hole filled with said material (II) extending through the second insulating layer to electrically connect said first circuit with said second circuit.

2. The multilayer circuit board according to claim 1, wherein said crystallizable glass is that in which crystallites of $CaAl_2Si_2O_8$, $BaAl_2Si_2O_8$, $NaAlSiO_4$ or $CaTiSiO_5$ deposit upon sintering.

3. The multilayer circuit board according to claim 1, wherein:
said inorganic insulating material is the crystallizable glass as defined in (I);
said conductive material is the mixture of a metal and non-crystallized glass as defined in (II)-(ii);
said resistor material is the mixture of the conductive material as defined in (III) and the non-crystallized glass as defined in (II)-(ii); and
said dielectric material is a lead-containing perovskite type oxide having a sintering temperature of 800°–1,000° C.

4. The multilayer circuit board according to claim 1, wherein:
said inorganic insulating material is the mixture of said insulating crystalline oxide and said non-crystallized glass as defined in (I)-(ii);
said conductive material is a metal;
said resistor material is the mixture of the conductive material as defined in (III) and the crystallizable glass as defined in (III)-(ii); and
said dielectric material is the admixture of the mixture as defined in (IV)-(a) and the non-crystallized glass as defined in (II)-(ii).

5. The multilayer circuit board according to claim 1, wherein:
said inorganic insulating material is said insulating polycrystalline oxide;
said conductive material is a mixture of a metal and non-crystallized glass as defined in (II)-(ii);
said resistor material is a mixture of the conductive material as defined in (III) and the crystallizable glass as defined in (III)-(ii); and
said dielectric material is the admixture of the mixture as defined in (IV)-(a) and the crystallizable glass as defined in (III)-(ii).

6. The multilayer circuit board according to claim 1, wherein said insulating crystalline oxide is at least one compound selected from the group consisting of $Al_2O_3$, $SiO_2$, MgO, CaO, BaO, $ZrO_2$, $CaZrO_3$, $MgAl_2O_4$, and $ZrSiO_4$; and said non-crystallized glass to be mixed with said insulating crystalline oxide is a lead alumino-borosilicate glass having a softening temperature of 750° C. or lower.

7. The multilayer circuit board according to claim 1, wherein said insulating polycrystalline oxide is $GeO_2$ or a mixture of $GeO_2$ with at least one compound selected from the group consisting of $SiO_2$, $Al_2O_3$, CaO, PbO, $Bi_2O_3$ and $B_2O_3$.

8. The multilayer circuit board according to claim 1, wherein said metal as defined in (II) is one metal selected from the group consisting of gold, silver, platinum and palladium.

9. The multilayer circuit board according to claim 1, wherein said metal as defined in (II) is an alloy.

10. A process for producing the multilayer circuit board according to claim 1, which comprises: (i) preparing a first insulating sheet as a green sheet from an insulator paste consisting of a powder of said inorganic insulating material (I) and an organic solvent; (ii) printing, on a surface of said first insulating sheet, a conductor paste consisting of a powder of said conductor material (II) and a vehicle, and also printing, on said first insulating sheet, at least one material selected from the group consisting of: a resistor paste consisting of a powder of said resistor material (III) and a vehicle; and a dielectric paste consisting of a powder of said dielectric material (IV) and a vehicle; followed by drying the printed paste, to form a first circuit pattern; (iii) then printing said insulator paste on the circuit-forming surface of said green sheet, in an arrangement that provides at least one through-hole in the printing paste, followed by drying the printed paste, thereby forming a second insulating layer with at least one through-hole, said at least one through-hole being positioned so as to permit electrical connection from said first circuit to above the second insulating sheet; (iv) filling said through-hole with said conductor paste; (v) printing, on the second insulating layer, said conductor paste and at least one material selected from the group consisting of: said resistor paste and said dielectric paste; followed by drying the printed paste, to thereby form a second circuit pattern; and carrying out firing to form said multilayer circuit board.

11. The process for producing the multilayer circuit board according to claim 10, wherein the crystallizable glass used in the insulating layers is that in which crystallites of $CaAl_2Si_2O_8$, $BaAl_2Si_2O$, $NaAlSiO_4$ or $CaTiSiO_5$ deposit upon sintering; said insulating crystalline oxide used in the insulating layers is at least one compound selected from the group consisting of $Al_2O_3$, $SiO_2$, MgO, CaO, BaO, $ZrO_2$, $CrZrO_3$, $MgAl_2O_4$ and $ZrSiO_4$; said noncrystallized glass to be mixed with the compound is a lead alumino-borosilicate glass having a softening point of 750° C. or lower; and said insulating polycrystalline oxide used in the insulating layers is $GeO_2$ or at least one kind of mixture selected from the mixtures prepared by adding any one compound selected from $SiO_2$, $Al_2O_3$, CaO, PbO, $Bi_2O_3$ and $B_2O_3$ to $GeO_2$.

12. The process for producing the multilayer circuit board according to claim 10, wherein at least one insulating layer having through-holes, to permit connection through said at least one insulating layer to the second circuit pattern, is formed on the second circuit pattern before carrying out the firing.

13. The process for producing the multilayer circuit board according to claim 10, wherein the firing is carried out for 10–30 minutes at a temperature of 600°–1,000° C., thereby forming the multilayer circuit board.

14. The process for producing the multilayer circuit board according to claim 12, wherein said at least one insulating layer formed on the second circuit pattern is formed by printing a layer of said insulator paste on the second circuit pattern.

* * * * *